United States Patent
Hsu

(10) Patent No.: US 9,907,188 B2
(45) Date of Patent: Feb. 27, 2018

(54) MULTIPORT POWER TRANSMISSION APPARATUS

(71) Applicant: ELIFECONNECTION CO., LTD., Taipei (TW)

(72) Inventor: Cheng-Tsuen Hsu, Taipei (TW)

(73) Assignee: ELIFECONNECTION CO., LTD., Taipei (TW)

( * ) Notice: Subject to any disclaimer, the term of this patent is extended or adjusted under 35 U.S.C. 154(b) by 237 days.

(21) Appl. No.: 14/882,404

(22) Filed: Oct. 13, 2015

(65) Prior Publication Data

US 2016/0036238 A1 Feb. 4, 2016

(30) Foreign Application Priority Data

May 4, 2015 (TW) .............................. 104114148 A

(51) Int. Cl.
*H02J 3/14* (2006.01)
*H05K 3/34* (2006.01)
*H05K 1/02* (2006.01)

(52) U.S. Cl.
CPC ......... *H05K 3/3447* (2013.01); *H05K 1/0209* (2013.01); *H05K 1/0263* (2013.01); *H05K 2201/09563* (2013.01); *H05K 2201/10272* (2013.01); *H05K 2201/10363* (2013.01)

(58) Field of Classification Search
CPC . H01R 2103/00; H01R 25/006; H01R 25/003
See application file for complete search history.

(56) References Cited

U.S. PATENT DOCUMENTS

2012/0129405 A1* 5/2012 Keshet ................... H01R 24/78
439/676

FOREIGN PATENT DOCUMENTS

| CN | 2174792 | 8/1994 |
|---|---|---|
| CN | 2374998 | 4/2000 |
| CN | 1427474 | 7/2003 |
| CN | 201584594 | 9/2010 |
| CN | 102083270 | 6/2011 |
| CN | 202797508 | 3/2013 |
| CN | 203617501 | 5/2014 |
| JP | 3515868 | 4/2004 |

OTHER PUBLICATIONS

"Office Action of China Counterpart Application," dated Feb. 4, 2017, p. 1-p. 5.

* cited by examiner

*Primary Examiner* — Sibin Chen
(74) *Attorney, Agent, or Firm* — JCIPRNET

(57) ABSTRACT

A multiport power transmission apparatus is provided. The multiport power transmission apparatus includes a PCB, sockets, switching modules, metal cross-lines, a neutral-line metal bar, and a live-line metal bar. The sockets and the switching modules are disposed on a component side of the PCB. The neutral-line metal bar and the live-line metal bar are disposed on a solder side of the PCB. The live-line metal bar is disposed between an orthogonal projection pattern of each socket and the neutral-line metal bar. A power input pin of each switching module is connected to the live-line metal bar through the solder side. A power-output pin of each switching module is connected to a live pin of a corresponding socket through the solder side. Two terminals of each metal cross-line are respectively connected to a neutral pin of a corresponding socket and the neutral-line metal bar through the solder side.

9 Claims, 6 Drawing Sheets

MULTIPORT POWER TRANSMISSION APPARATUS

CROSS-REFERENCE TO RELATED APPLICATION

This application claims the priority benefit of Taiwan application serial no. 104114148, filed on May 4, 2015. The entirety of the above-mentioned patent application is hereby incorporated by reference herein and made a part of this specification.

BACKGROUND

Field of the Invention

The invention is directed to a power apparatus and more particularly, to a multiport power transmission apparatus.

Description of Related Art

In modem life, the usage of electrical appliances is quite popular, and people's demands on electrical appliances have been increased day by day. Many families or offices purchase power extension cords for extending the use of electrical appliances, and some of them even choose smart power extension cords for both energy saving and electrical safety. A smart power extension cord common has smart switches. The smart switches when being overused or overloaded can be automatically powered off or be controlled for conduction switching.

Generally, the smart extension cord has many more components than an ordinary power extension cord. Thus, the layout design of a PBC of the smart power extension cord has higher difficulty. The smart power extension cord usually has to detect load power values on its sockets, so as to protect the internal components of the smart power extension cord when the sockets are overloaded. A larger space and area have to be reserved on the PCB of the smart power extension cord for wiring a live line, a neutral line and a ground line, and thus, during the aforementioned components are laid out, traces between certain components have to cross the live line or the neutral line. Besides, a large current flowing through the live line the neutral line and heat generated thereby may cause interference to the signals on traces between the components. On the other hand, the live line and the neutral line are wired by being directly soldered on the surface of the PCB using molten tin. Once the current flowing though the live line and the neutral line is too large, the heat generated on the live line or the neutral line may cause damage to the PCB due to being deformed.

The situations mentioned above may cause significantly increased difficulty and complexity to the layout design of the PCB of the smart power extension cord, especially to the smart power extension cord having a plurality of sockets (ports). Because of this, currently available smart extension cords are commonly equipped with a single socket (port).

SUMMARY

Accordingly, the invention provides a multiport power transmission apparatus. The multiport power transmission apparatus has a simple layout structure and a good heat-dissipation effect, which can enhance the electrical safety.

The invention is directed to a multiport power transmission apparatus including a PCB, a plurality of sockets, a plurality of switching modules, a plurality of metal cross-lines, a neutral-line metal bar and a live-line metal bar. The PCB has a component side and a solder side. The sockets is disposed on the component side. Each of the sockets has a live-line pin and a neutral-line pin. The switching modules are disposed on the component side. Each of the switching modules has a power-input pin and a power-output pin, wherein the power-output pin of each of the switching modules is electrically connected with the live-line pin of a corresponding socket among the sockets through the solder side. A first terminal of each of the metal cross-lines is electrically connected with the neutral-line pin of a corresponding socket among the sockets through the solder side. The neutral-line metal bar is disposed on the solder side. The neutral-line metal bar has a plurality of second solder portions, wherein each of the second solder portions is electrically connected with a second terminal of a corresponding metal cross-line among the metal cross-lines through the solder side. The live-line metal bar is disposed on the solder side. The live-line metal bar is located between an orthogonal projection pattern of each of the sockets on the solder side and the neutral-line metal bar. The live-line metal bar has a plurality of first solder portions, wherein each of the first solder portions electrically connected with the power-input pin of a corresponding switching module among the switching modules through the solder side.

In an embodiment of the invention, a gap is between each of the metal cross-lines and the component side. An orthogonal projection pattern of each of the metal cross-lines and an orthogonal projection pattern of the live-line metal bar intersect with each other on the component side.

In an embodiment of the invention, each of the metal cross-lines is made of a metal material with zero temperature coefficient of resistance (TCR) or a low TCR (50-200 ppm/° C.).

In an embodiment of the invention, the multiport power transmission apparatus further includes a detection module. The detection module is disposed on the component side. The detection module is electrically connected with the first terminals and the second terminals of the metal cross-lines through a plurality of traces on the PCB and detects a voltage drop between the first terminal and the second terminal of each of the metal cross-lines or detects a current flowing through each of the metal cross-lines, so as to measure a load power value of each of the sockets.

In an embodiment of the invention, the live-line metal bar, except the first solder portions, does not contact the PCB. The neutral-line metal bar, except the second solder portions, does not contact the PCB.

In an embodiment of the invention, the first solder portions of the live-line metal bar are located on a long side of the live-line metal bar. A plurality of gaps is between the long side and the solder side, and another long side opposite to the long side has a bent portion.

In an embodiment of the invention, the second solder portions of the neutral-line metal bar are located on a long side of the neutral-line metal bar. A plurality of gaps is between the long side and the solder side, and another long side opposite to the long side has a bent portion.

In an embodiment of the invention, each of the first solder portions of the live-line metal bar is inserted into the component side through a corresponding conduction via on the solder side and is electrically connected with a first conduction plane of the solder side by means of molten-tin soldering. The power-input pin of each of the switching modules is inserted into the solder side through a corresponding conduction via on the component side and is electrically connected with the first conduction plane of the solder side by means of molten-tin soldering. The power-output pin of each of the switching modules is inserted into the solder side through a corresponding conduction via on the component side and is electrically connected with a second conduction plane of the solder side by means of molten-tin soldering. The live-line pin of each of the sockets is inserted into the solder side through a corresponding conduction via on the component side and is electrically connected with the second conduction plane of the solder side by means of molten-tin soldering. The neutral-line pin of each of the sockets is inserted into the solder side through a corresponding conduction via on the component side and is electrically connected with a third conduction plane of the solder side by means of molten-tin soldering. The first terminal of each of the metal cross-lines is inserted into the solder side through a corresponding conduction via on the component side and is electrically connected with the third conduction plane of the solder side by means of molten-tin soldering. The second terminal of each of the metal cross-lines is inserted into the solder side through a corresponding conduction via on the component side and is electrically connected with a fourth conduction plane of the solder side by means of molten-tin soldering. Each of the second solder portions of the neutral-line metal bar is inserted into the component side through a corresponding conduction via on the solder side and is electrically connected with the fourth conduction plane of the solder side by means of molten-tin soldering. The second terminal of each of the metal cross-lines is directly soldered to a corresponding second solder portion among the second solder portions of the neutral-line metal bar.

In an embodiment of the invention, the multiport power transmission apparatus further includes a ground-line metal bar. The ground-line metal bar is disposed on the solder side. The ground-line metal bar has a plurality of third solder portions. Each of the third solder portions being inserted into the component side through a corresponding conduction via on the solder side and is electrically connected with a ground plane of the solder side by means of molten-tin soldering. Each of the sockets further has a ground-line pin. The ground-line pin of each of the sockets is inserted into the solder side through a corresponding conduction via on the component side and is electrically connected the ground plane of the solder side by means of molten-tin soldering. The ground-line pin of each of the sockets is directly soldered to a corresponding third solder portion among the third solder portions of the ground-line metal bar.

In an embodiment of the invention, the third solder portions of the ground-line metal bar are located on a long side of the ground-line metal bar. A plurality of gaps is between the long side and the solder side, and another long side opposite to the long side has a bent portion.

To sum up, in the multiport power transmission apparatus of the invention, the live-line metal bar and the neutral-line metal bar are disposed on the solder side of the PCB. There are gaps between the live-line metal bar and the solder side, and there are also gaps between the neutral-line metal bar and the solder side. The metal cross-lines are disposed on the component side or the solder side of the PCB. The neutral-line pins of the sockets can cross the live-line metal bar through the metal cross-lines and be electrically connected with the neutral-line metal bar, and there are also gaps between the metal cross-lines and the component side. In this way, wires between the detection module and the metal cross-lines can be prevented from crossing the live-line metal bar or the neutral-line metal bar on the PCB, such that difficulty and complexity of the layout design of the multiport power transmission apparatus can be reduced. Additionally, the heat generated on the metal cross-lines can also be dissipated by using the neutral-line metal bar, and the gaps between the metal cross-lines and the PCB, the gaps between the neutral-line metal bar and the PCB and the gaps between the live-line metal bar and the PCB can facilitate in preventing the heat from accumulating on the PCB. Thus, the PCB can be prevented from being deformed due to the heat, which contributes to enhancing the electrical safety.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
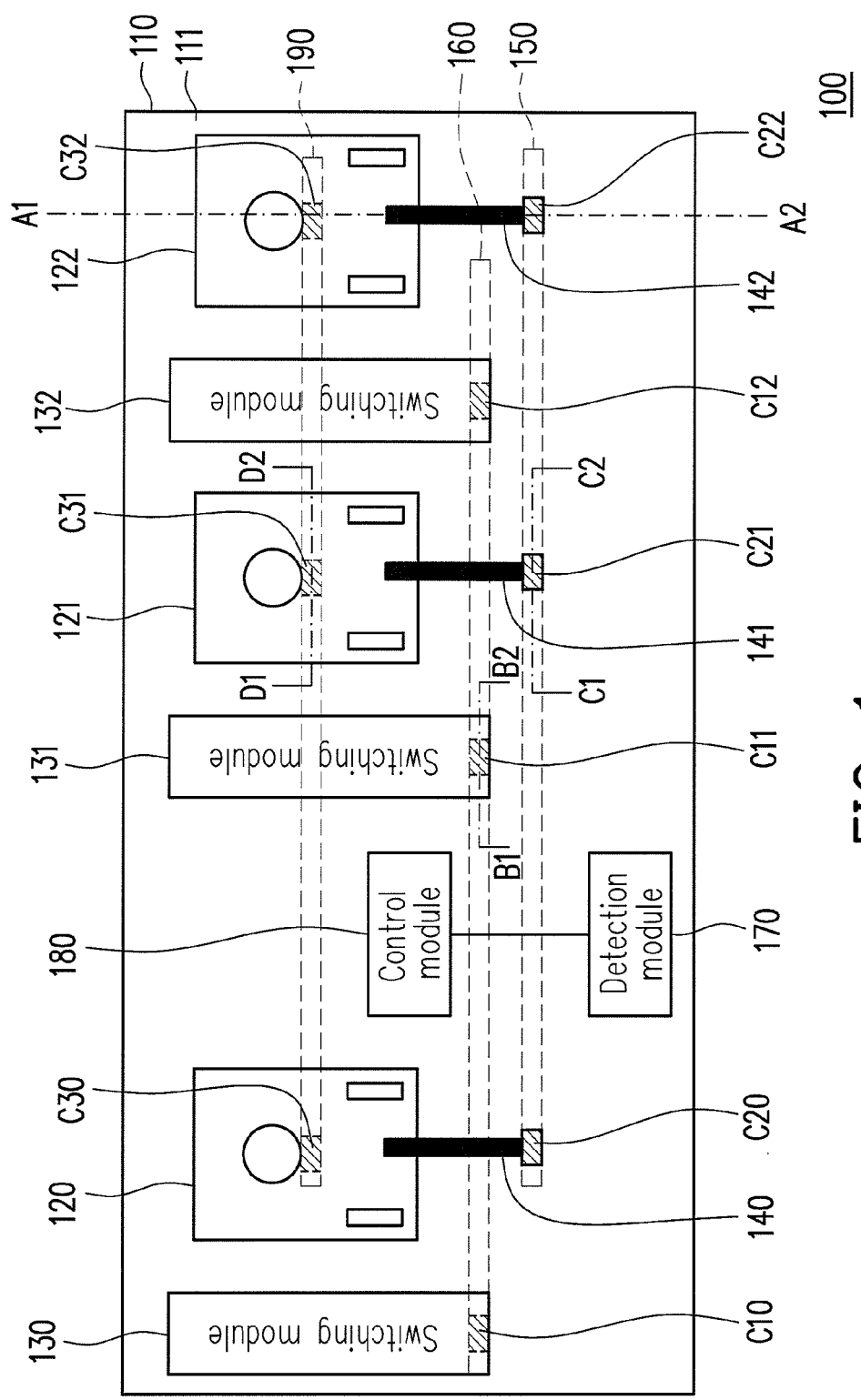
FIG. 1 is a schematic front view illustrating a multiport power transmission apparatus according to an embodiment of the invention.

In order to make the content of the invention clearer, the following embodiments are illustrated as examples that can be truly implemented by the invention. Wherever possible, the same reference numbers are used in the drawings and the description to refer to the same or like parts.

Figure 2:
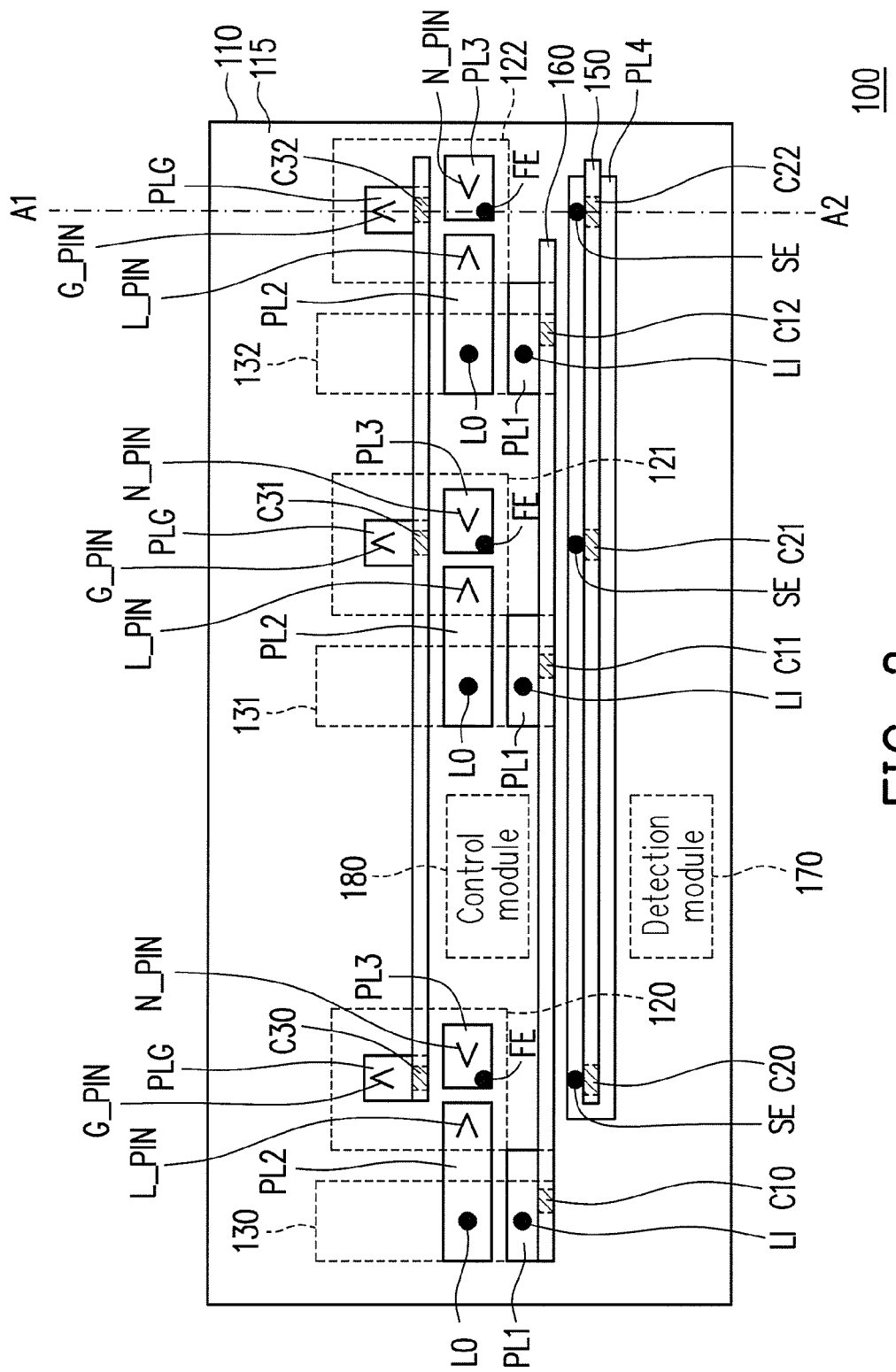
FIG. 2 is a schematic back view illustrating the multiport power transmission apparatus depicted in FIG. 1.
Figure 3:
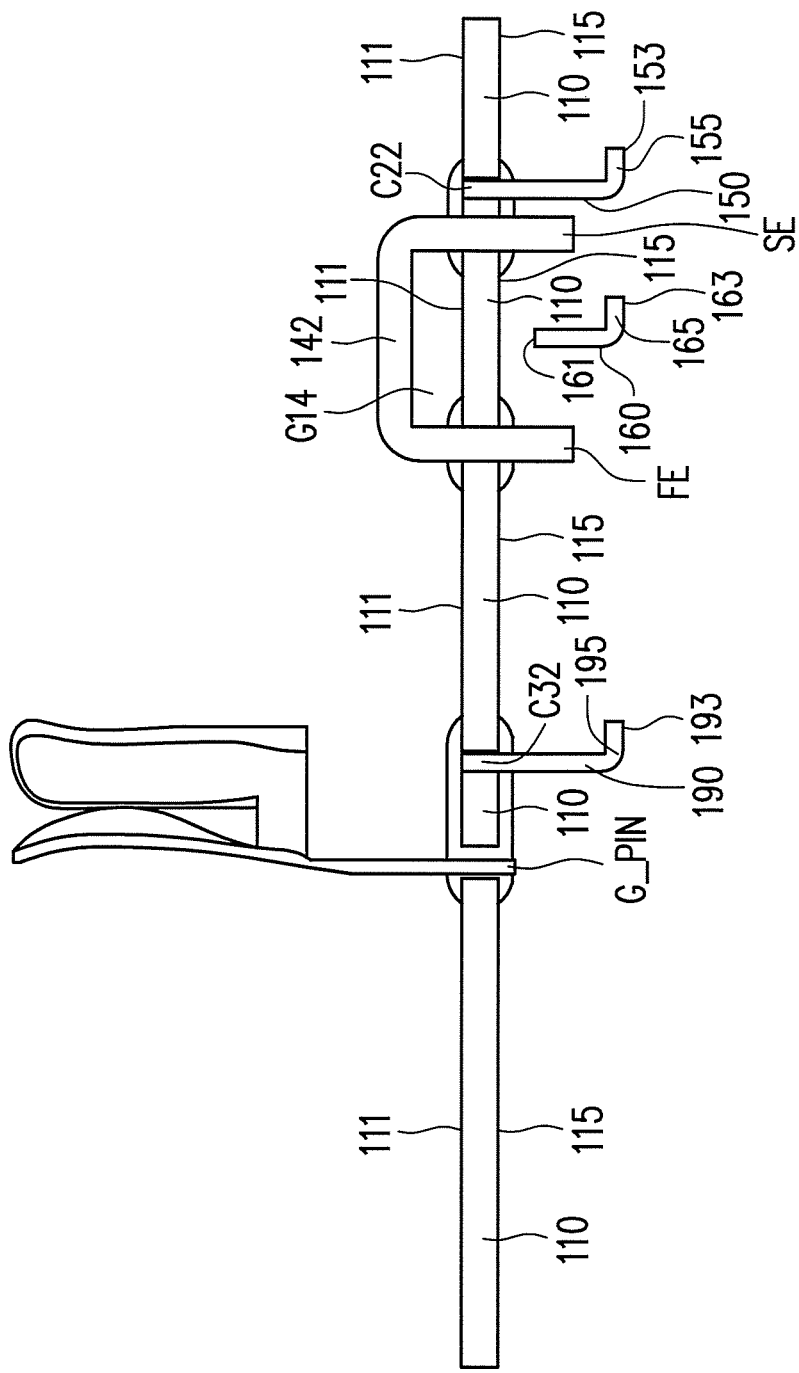
FIG. 3 is a cross-sectional side view illustrating the multiport power transmission apparatus depicted in FIG. 1 and FIG. 2 along a section line A1-A2.

Referring to FIG. 1, FIG. 2 and FIG. 3 simultaneously, FIG. 1 is a schematic front view illustrating a multiport power transmission apparatus 100 according to an embodiment of the invention, FIG. 2 is a schematic back view illustrating the multiport power transmission apparatus 100 depicted in FIG. 1, and FIG. 3 is a cross-sectional side view illustrating the multiport power transmission apparatus depicted in FIG. 1 and FIG. 2 along a section line A1-A2. The multiport power transmission apparatus 100 may include a PCB 110, a plurality of sockets 120-122, a plurality of switching modules 130-132, a plurality of metal cross-lines 140-142, a neutral-line metal bar 150, and a live-line metal bar 160, but the invention is not limited thereto.

The PCB 110 has a component side 111 and a solder side 115. The sockets 120-122 may be disposed on the component side 111. Each of the sockets (e.g., the socket 120) has a live-line pin L_PIN and a neutral-line pin N_PIN. The switching modules 130-132 are disposed on the component side 111. Each of the switching modules (e.g., the switching module 130) has a power-input pin LI and a power-output pin LO. The power-output pin LO of the switching module 130 may be connected with the live-line pin L_PIN of the socket 120 through the solder side 115. In the same way, the power-output pin LO of each of the switching modules 131-132 may be electrically connected with the live-line pin L_PIN of each of the sockets 121-122 through the solder side 115.

In an embodiment of the invention, the metal cross-lines 140-142 may be disposed on the component side 111, but the invention is not limited thereto. In other embodiments of the invention, the metal cross-lines 140-142 may also be disposed on the solder side 115, which depends on the actual application or design requirements. A first terminal FE of the metal cross-line 140 may be electrically connected with the neutral-line pin N_PIN of the socket 120 through the solder side 115. In the same way, the first terminal FE of each of the metal cross-lines 141-142 may be electrically connected with the neutral-line pin N_PIN of each of the sockets 121-122 through the solder side 115.

The neutral-line metal bar 150 may be disposed on the solder side 115. The neutral-line metal bar 150 may have a plurality of second solder portions C20-C22. The second solder portion C20 may be electrically connected with the second terminal SE of the metal cross-line 140 through the solder side 115. In the same way, each of the second solder portions C21-C22 may be electrically connected with the second terminal SE of each of the metal cross-lines 141-142 through the solder side 115. It is to be mentioned that a material of the neutral-line metal bar 150 may be copper, but the invention is not limited thereto. For instance, in other embodiments of the invention, the neutral-line metal bar 150 may also be implemented by using a metal (or alloy) material with a low price, good conductivity and soderability, such as by using a copper alloy or tin-plated copper alloy, which depends on the actual application or design requirements.

The live-line metal bar 160 is disposed on the solder side 115. The live-line metal bar 160 is located between an orthogonal projection pattern of each of the sockets 120-122 on the solder side 115 and the neutral-line metal bar 150. The live-line metal bar 160 may have a plurality of first solder portions C10-C12. The first solder portion C10 may be electrically connected with a power-input pin LI of the switching module 130 through the solder side 115. In the same way, each of the first solder portions C11-C12 may be electrically connected with a power-input pin LI of each of the switching modules 131-132 through the solder side 115. It is to be mentioned herein that the live-line metal bar 160 may be made of copper, but the invention is not limited thereto. For instance, in other embodiments of the invention, the live-line metal bar 160 may also be implemented by using a metal (or alloy) material with a low price, good conductivity and solderability, such as by using a copper alloy or tin-plated copper alloy, which depends on the actual application or design requirements.

In the present embodiment, the neutral-line metal bar 150 and the live-line metal bar 160 may be electrically connected with plugs (not shown) of the multiport power transmission apparatus 100. In this way, the plugs of the multiport power transmission apparatus 100 may be coupled to a city power supply system (not shown) to receive and provide an AC power to the sockets 120-122 of the multiport power transmission apparatus 100, so as to provide power required by electrical appliances on the sockets 120-122. For instance, when a plug of an appliance is inserted to the sockets 120, a closed power supply circuit may be formed among the live-line metal bar 160, the switching module 130, the live-line pin L_PIN of the socket 120, the appliance, the neutral-line pin N_PIN of the socket 120, the metal cross-lines 140, the neutral-line metal bar 150 and the city power supply system. The AC power may be, for example, a 110V or 220V AC power, but the invention is not limited thereto.

Furthermore, the first solder portion C10 of the live-line metal bar 160 may be inserted into the component side 111 through a corresponding conduction via on the solder side 115 and may be electrically connected with a first conduction plane PL1 of the solder side 115 by means of molten-tin soldering. In the same way, the first solder portions C11-C12 of the live-line metal bar 160 may be inserted into the component side 111 through corresponding conduction vias on the solder side 115 and may be electrically connected with the first conduction plane PL1 of the solder side 115 by means of molten-tin soldering.

The power-input pin LI of the switching module 130 may be inserted into the solder side 115 through a corresponding conduction via on the component side 111 and may be electrically connected with the first conduction plane PL1 of the solder side 115 by means of molten-tin soldering. In the same way, the power-input pin LI of each of the switching modules 131-132 may be inserted into the solder side 115 through a corresponding conduction via on the component side 111 and may be electrically with the first conduction plane PL1 of the solder side 115 by means of molten-tin soldering.

The power-output pin LO of the switching modules 130 may be inserted into the solder side 115 through a corresponding conduction via on the component side 111 and may be electrically connected with a second conduction plane PL2 of the solder side 115 by means of molten-tin soldering. In the same way, the power-output pin LO of each of the switching modules 131-132 may be inserted into the solder side 115 through a corresponding conduction via on the component side 111 and may be electrically connected with the second conduction plane PL2 of the solder side 115 by means of molten-tin soldering.

The live-line pin L_PIN of the socket 120 may be inserted into the solder side 115 through a corresponding conduction via on the component side 111 and may be electrically connected with the second conduction plane PL2 of the solder side 115 by means of molten-tin soldering. In the same way, the live-line pin L_PIN of each of the sockets 121-122 may be inserted into the solder side 115 through a corresponding conduction via on the component side 111 and may be electrically connected with the second conduction plane PL2 of the solder side 115 by means of molten-tin soldering.

The neutral-line pin N_PIN of the socket 120 may be inserted into the solder side 115 through a corresponding conduction via on the component side 111 and may be electrically connected with a third conduction plane PL3 of the solder side 115 by means of molten-tin soldering. In the same way, the neutral-line pin N_PIN of each of the sockets 121-122 may be inserted into the solder side 115 through a corresponding conduction via on the component side 111 and may be electrically connected with the third conduction plane PL3 of the solder side 115 by means of molten-tin soldering.

The first terminal FE of the metal cross-line 140 may be inserted into the solder side 115 through a corresponding conduction via on the component side 111 and may be electrically connected with the third conduction plane PL3 of the solder side 115 by means of molten-tin soldering. In the same way, the first terminal FE of each of the metal cross-lines 141-142 may be inserted into the solder side 115 through a corresponding conduction via on the component side 111 and may be electrically connected with the third conduction plane PL3 of the solder side 115 by means of molten-tin soldering.

The second terminal SE of the metal cross-line 140 may be inserted into the solder side 115 through a corresponding conduction via on the component side 111 and may be electrically connected with a fourth conduction plane PL4 of the solder side 115 by means of molten-tin soldering. In the same way, the second terminal SE of each of the metal cross-lines 141-142 may be inserted into the solder side 115 through a corresponding conduction via on the component side 111 and may be electrically connected with the fourth conduction plane PL4 of the solder side 115 by means of molten-tin soldering.

The second solder portions C20 of the neutral-line metal bar 150 may be inserted into the component side 111 through a corresponding conduction via on the solder side 115 and may be electrically connected with the fourth conduction plane PL4 of the solder side 115 by means of molten-tin soldering. In the same way, the second solder portions C21-C22 of the neutral-line metal bar 150 may be inserted into the component side 111 through corresponding conduction vias on the solder side 115 and may be electrically connected with the fourth conduction plane PL4 of the solder side 115 by means of molten-tin soldering.

In an embodiment of the invention, the second terminal SE of the metal cross-line 140 and the second solder portion C20 of the neutral-line metal bar 150 may be directly soldered together using molten tin to increase conductivity between the second terminal SE of the metal cross-line 140 and the neutral-line metal bar 150. In the same way, the second terminals SE of each of the metal cross-lines 141-142 and each of the second solder portions C21-C22 of the neutral-line metal bar 150 may be directly soldered together using molten tin to increase conductivity between the second terminal SE of each of the metal cross-lines 141-142 and the neutral-line metal bar 150.

In an embodiment of the invention, the first conduction plane PL1, the second conduction plane PL2, the third conduction plane PL3 and the fourth conduction plane PL4 are isolated from one another, as shown in FIG. 2. It is to be specially mentioned herein that sizes and shapes of the first conduction plane PL1, the second conduction plane PL2, the third conduction plane PL3 and the fourth conduction plane PL4 are exemplarily illustrated in FIG. 2, but construe no limitations to the invention. The sizes and the shapes of the first conduction plane PL1, the second conduction plane PL2, the third conduction plane PL3 and the fourth conduction plane PL4 may be determined depending on the actual application or design requirements. In addition, in the present embodiment, the three sockets 120-122 disposed on the PCB 110 are merely illustrated for example, but construes no limitations to the invention. In other words, the invention is not intent to limit the number of the sockets.

In an embodiment of the invention, the multiport power transmission apparatus 100 may further include a detection module 170. The detection module 170 may be disposed on the component side 111. The detection module 170 may be electrically connected with the first terminal FE and the second terminal SE of each of the metal cross-lines 140-142 through a plurality of traces (not shown) on the PCB 110 to measure a load power value of each of the sockets 120-122. The traces may be disposed on the component side 111 or the solder side 115 of the PCB 110, which depends on the actual application or design requirements. Furthermore, the detection module 170 may measure the load power value of the sockets 120 through detecting a voltage drop between the first terminal FE and the second terminal SE of the metal cross-line 140 or a current flowing through the metal cross-line 140. In the same way, the detection module 170 may measure the load power value of the sockets 121 through detecting the voltage drop between the first terminal FE and the second terminal SE of the metal cross-line 141 or a current flowing through the metal cross-line 141. Alternatively, the detection module 170 may measure the load power value of the socket 122 through detecting a voltage drop between the first terminal FE and the second terminal SE of the metal cross-line 142 or a current flowing through the metal cross-line 142.

In the present embodiment, the metal cross-lines 140-142 (taking the metal cross-line 142 illustrated in FIG. 3 as an example) may be inverted-U shaped, but the invention is not limited thereto. In other embodiments of the invention, the metal cross-lines 140-142 may also be semi-circular, parabolic or inverted V-shaped. Actually, the shapes of the metal cross-lines 140-142 may be determined depending on the actual application or design requirements. A gap G14 is between each of the metal cross-line 140-142 (taking the metal cross-line 142 illustrated in FIG. 3 as an example) and the component side 111. An orthogonal projection pattern of each of the metal cross-lines 140-142 intersects with an orthogonal projection pattern of the live-line metal bar 160 on the component side 111 (as shown in FIG. 1). It may be learned that neutral-line pins N_PIN of the sockets 120-122 may cross the live-line metal bar 160 and be electrically connected with the neutral-line metal bar 150 respectively through the metal cross-lines 140-142.

Besides, in an embodiment of the invention, the live-line metal bar 160, except the first solder portions C10-C12, does not contact with the PCB 110. In the same way, the neutral-line metal bar 150, except the second solder portions C20-C22, does not contact with the PCB 110. In this way, the traces between the detection module 170 and the metal cross-lines 140-142 may be prevented from crossing the live-line metal bar 160 or crossing the neutral-line metal bar 150, such that difficulty and complexity of the wiring of the PCB 110 can be reduced.

On the other hand, when loads (e.g., electrical appliances) on the sockets 120-122 consume higher power, a larger current may flow from the neutral-line pin N_PIN of each of the sockets 120-122 to the neutral-line metal bar 150 through each of the metal cross-lines 140-142. In this circumstance, the heat is generated on the metal cross-lines 140-142 due to the current flowing through and may be dissipated through the neutral-line metal bar 150. In addition, due to the gap G14 between each of the metal cross-lines 140-142 and the component side 111 of the PCB 110, and the neutral-line metal bar 150, except the second solder portions C20-C22, not contacting with the PCB 110, the PCB 110 may be prevented from being deformed due to the heat accumulated thereon, which contributes to enhancement of electrical safety.

In an embodiment of the invention, the metal cross-lines 140-142 may be made of, for example, a metal with zero temperature coefficient of resistance (TCR), but the invention is not limited thereto. In other embodiments of the invention, the metal cross-lines 140-142 may also be made of a metal material with a low TCR (50-200 ppm/° C.). In this way, impedance of the metal cross-lines 140-142 may be prevented from being changed due to temperature change. Thus, the detection module 170 may accurately detects the load power values of the sockets 120-122 through the metal cross-lines 140-142 made of the zero-TCR or the low-TCR (50-200 ppm/° C.) metal material.

In an embodiment of the invention, the metal material of the metal cross-lines 140-142 may include, for example, a manganese copper alloy or a copper constantan alloy, but the invention is not limited thereto. In an embodiment of the invention, a resistance value of each of the metal cross-lines 140-142 may be, for example, 4 mΩ, but the invention is not limited thereto.

Figure 4:
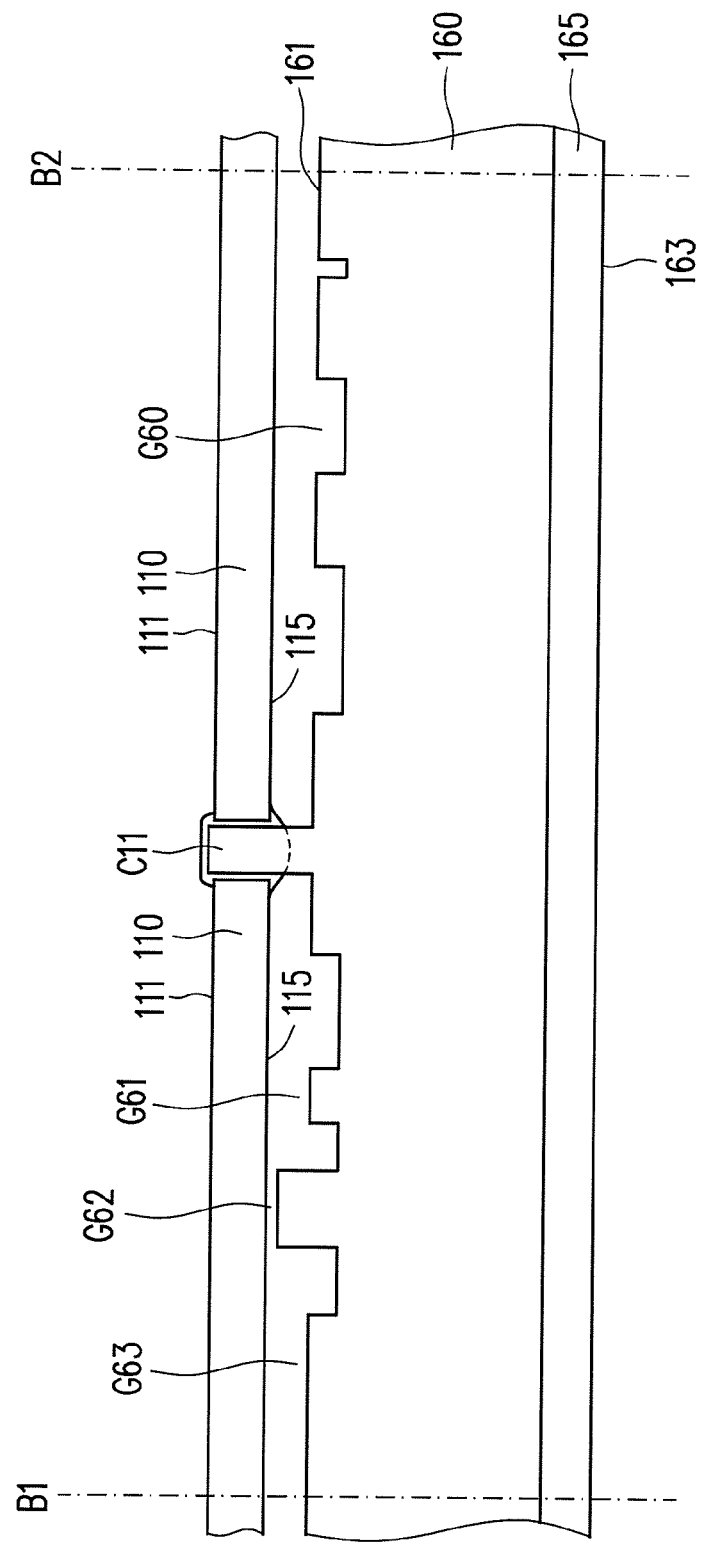
FIG. 4 is a cross-sectional view illustrating the multiport power transmission apparatus depicted in FIG. 1 and FIG. 2 along a section line B1-B2.

Referring to FIG. 1 through FIG. 4 simultaneously hereinafter, FIG. 4 is a cross-sectional view illustrating the multiport power transmission apparatus 100 depicted in FIG. 1 and FIG. 2 along a section line B 1 -B2. With reference to FIG. 4, the first solder portion C11 of the live-line metal bar 160 is located on a long side 161 of the live-line metal bar 160. A plurality of gaps G60-G63 may be between the long side 161 and the solder side 115, and another long side 163 opposite to the long side 161 may have a bent portion 165 (as shown in FIG. 3 and FIG. 4). Therein, the gaps G60-G63 and the bent portion 165 may serve to enhance the dissipation effect of the live-line metal bar 160. Besides, the bent portion 165 may also contribute to increase the structural strength of the live-line metal bar 160 to prevent the live-line metal bar 160 from being deformed due to being extruded.

It should be noted that the style of the long side 161 of the live-line metal bar 160 is merely illustrated as an example in FIG. 4, but construes no limitations to the invention. Besides, sizes of the gaps G60-G63 between the long side 161 of the live-line metal bar 160 and the solder side 115 may also be adjusted according to design requirements. For instance, if the gap G62 on the solder side 115 adjacent to the long side 161 of the live-line metal bar 160 is not arranged with a trace passing through, the gap G62 between the long side 161 and the solder side 115 of the live-line metal bar 160 may be shrunk, or the gap G62 may even be omitted.

Figure 5:
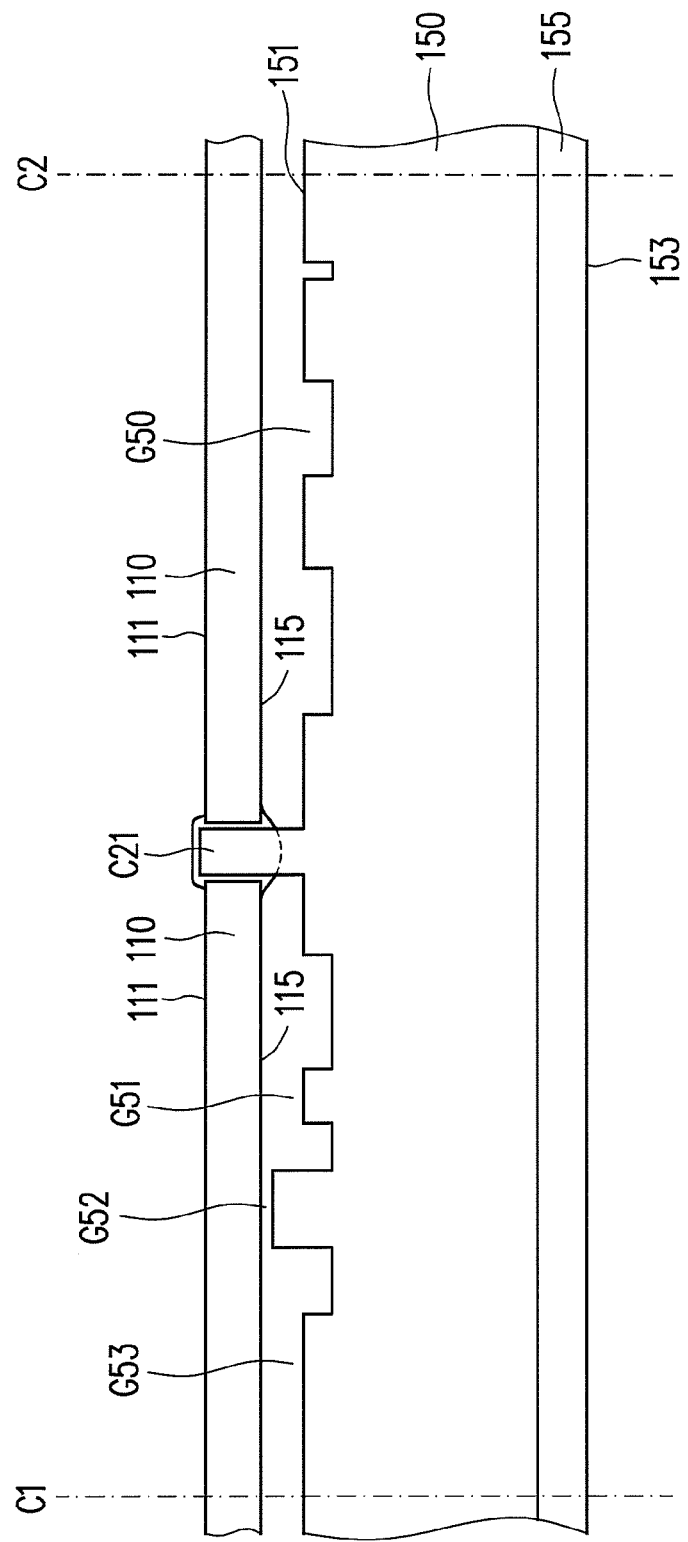
FIG. 5 is a cross-sectional view illustrating the multiport power transmission apparatus depicted in FIG. 1 and FIG. 2 along a section line C1-C2.

Referring to FIG. 1 through FIG. 3 and FIG. 5 simultaneously hereinafter, FIG. 5 is a cross-sectional view illustrating the multiport power transmission apparatus 100 depicted in FIG. 1 and FIG. 2 along a section line C1-C2. With reference to FIG. 5, the second solder portion C21 of the neutral-line metal bar 150 is located on a long side 151 of the neutral-line metal bar 150. A plurality of gaps G50-G53 may be between the long side 151 and the solder side 115, and another long side 153 opposite to the long side 151 may have a bent portion 155 (as shown in FIG. 3 and FIG. 5). Therein, the gaps G50-G53 and the bent portion 155 may serve to enhance the dissipation effect of the neutral-line metal bar 150. Besides, the bent portion 155 may also contribute to increase the structural strength of the neutral-line metal bar 150 to prevent the neutral-line metal bar 150 from being deformed due to being extruded.

It should be noted that that the style of the long side 151 of the neutral-line metal bar 150 is merely illustrated as an example in FIG. 5, but construes no limitations to the invention. Besides, sizes of the gaps G50-G53 between the long side 151 of the neutral-line metal bar 150 and the solder side 115 may also be adjusted according to design requirements. For instance, if the gap G52 on the solder side 115 adjacent to the long side 151 of the neutral-line metal bar 150 is not arranged with a trace passing through, the gap G52 between the long side 151 and the solder side 115 of the neutral-line metal bar 150 may be shrunk, or the gap G52 may even be omitted.

In an embodiment of the invention, the multiport power transmission apparatus 100 may further include a control module 180, but the invention is not limited thereto. The control module 180 may be disposed on the component side 111. The control module 180 may be electrically connected with the detection module 170 to receive the load power values of the sockets 120-122 measured by the detection module 170. The control module 180 may correspondingly control turning on/off of the switching module 130 according to the load power value of the socket 120 measured by the detection module 170, so as to protect the switching module 130. In the same way, the control module 180 may correspondingly control turning on/off of the switching modules 131-132 according to the load power values of the sockets 121-122 measured by the detection module 170, so as to protect the switching modules 131-132. However, the invention is not limited thereto, and the function of the control module 180 may be determined depending on the actual application or design requirements. Additionally, in the present embodiment, the disposition of the three switching modules 131-132 on the PCB 110 is merely illustrated as an example, but construes no limitations to the invention. In other words, the invention is not intent to limit the number of the switching modules.

In an embodiment of the invention, the multiport power transmission apparatus 100 may further include a ground-line metal bar 190. The ground-line metal bar 190 may be disposed on the solder side 115. The ground-line metal bar 190 may have a plurality of third solder portions C30-C32. Each of the third solder portions C30-C32 may be respectively inserted into the component side 111 through a corresponding conduction via on the solder side 115 and may be electrically connected with a ground plane PLG of the solder side 115 by means of molten-tin soldering. Each of the sockets 120-122 may further have a ground-line pin G_PIN. The ground-line pin G_PIN of each of the sockets 120-122 may be inserted into the solder side 115 through a corresponding conduction via on the component side 111 and may be electrically connected with the ground plane PLG of the solder side 115 by means of molten-tin soldering. It should be noted that the ground-line metal bar 190 may be made of copper, but the invention is not limited thereto. For instance, in other embodiments of the invention, the ground-line metal bar 190 may also be implemented by using a metal (or alloy) material with a low price, good conductivity and solderability, such as by using a copper alloy or tin-plated copper alloy, which depends on the actual application or design requirements.

The ground-line pin G_PIN of the socket 120 and the third solder portion C30 of the ground-line metal bar 190 may be directly soldered together using molten tin to increase conductivity between the ground-line pin G_PIN of the socket 120 and the ground-line metal bar 190. In the same way, the ground-line pin G_PIN of each of the sockets 121-122 and each of the third solder portions C31-C32 of the ground-line metal bar 190 may be directly soldered together using molten tin to increase conductivity between the round-line pin G_PIN of each of the sockets 121-122 and the ground-line metal bar 190.

Figure 6:
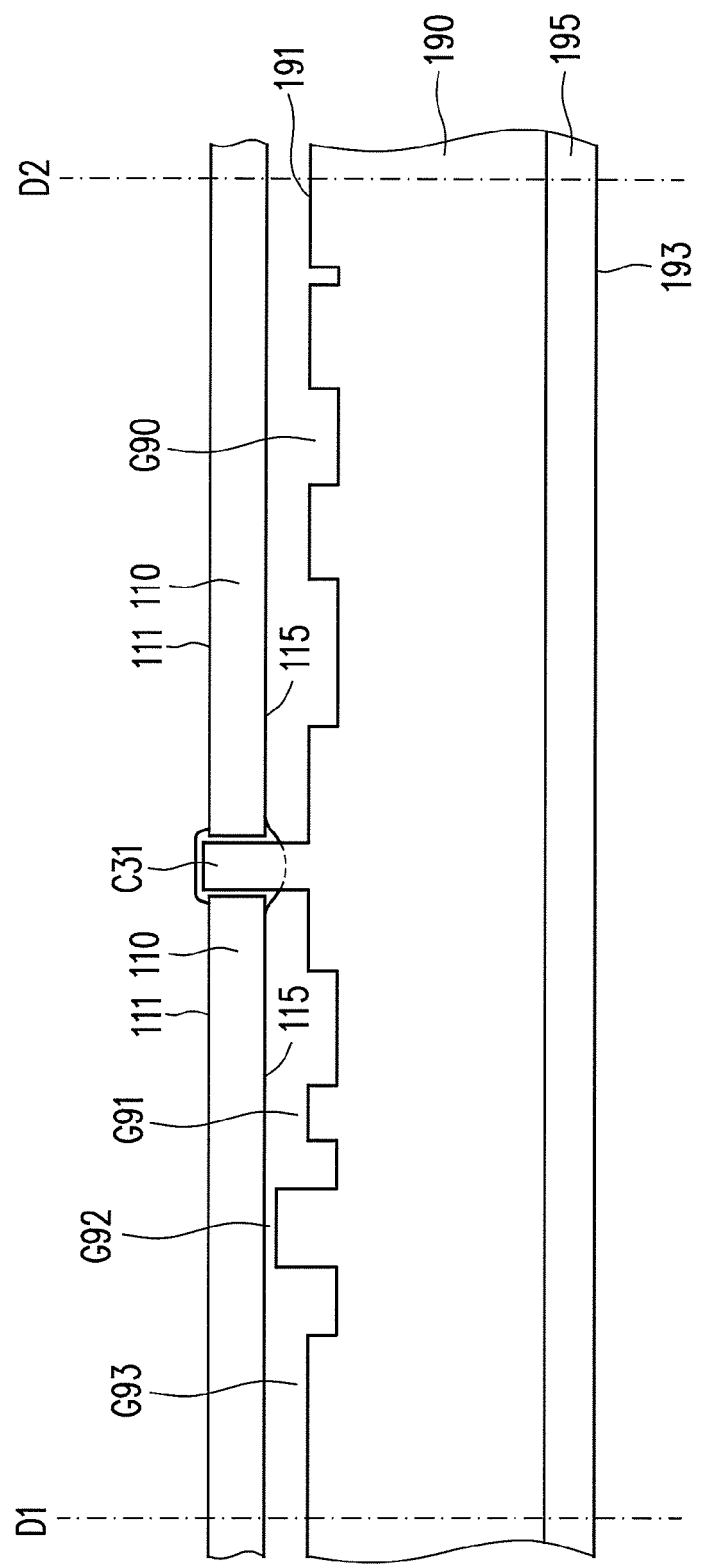
FIG. 6 is a cross-sectional view illustrating the multiport power transmission apparatus depicted in FIG. 1 and FIG. 2 along a section line D1-D2.

Referring to FIG. 1 through FIG. 3 and FIG. 6, FIG. 6 is a cross-sectional view illustrating the multiport power transmission apparatus 100 depicted in FIG. 1 and FIG. 2 along a section line D1-D2. FIG. 6 illustrates a ground-line metal bar 190 similar to the live-line metal bar 160 of FIG. 4 and the neutral-line metal bar 150 of the FIG. 5. Thus, description with respect to the structure of the ground-line metal bar 190 and gaps G90-G92 between the ground-line metal bar 190 and the solder side 115 may refer to the related descriptions of FIG. 4 or FIG. 5 and will not be repeated.

In light of the foregoing, the live-line metal bar and the neutral-line metal bar of the multiport power transmission apparatus provided by the embodiments of the invention can be disposed on the solder side of the PCB. There are gaps between the live-line metal bar and the solder side, and there are also gaps between the neutral-line metal bar and the solder side. The metal cross-lines can be disposed on the component side or the solder side of the PCB. The neutral-line pins of the sockets can cross the live-line metal bar through the metal cross-lines and be electrically connected with the neutral-line metal bar, and there are also gaps between each of the metal cross-lines and the component side. In this way, the traces on the PCB between the detection module and the metal cross-lines can be prevented from crossing the live-line metal bar or the neutral-line metal bar, such that the difficulty and the complexity of the layout design of the multiport power transmission apparatus can be reduced. In addition, the heat on the metal cross-lines can be separately dissipated through the neutral-line metal bar, the gaps between the metal cross-lines and the PCB, the gaps between the neutral-line metal bar and the PCB and the gaps between the live-line metal bar and the PCB to prevent the heat from accumulating on the PCB. In this way, the PCB can be prevented from being deformed due to the heat and the electrical safety can be further enhanced.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A multiport power transmission apparatus, comprising:
a PCB, having a component side and a solder side;
a plurality of sockets, disposed on the component side, and each of the sockets having a live-line pin and a neutral-line pin;
a plurality of switching modules, disposed on the component side, and each of the switching modules having a power-input pin and a power-output pin, wherein the power-output pin of each of the switching modules is electrically connected with the live-line pin of a corresponding socket among the sockets through the solder side;
a plurality of metal cross-lines, a first terminal of each of the metal cross-lines being electrically connected with the neutral-line pin of a corresponding socket among the sockets through the solder side;
a neutral-line metal bar, disposed on the solder side and having a plurality of second solder portions, wherein each of the second solder portions is electrically connected with a second terminal of a corresponding metal cross-line among the metal cross-lines through the solder side; and
a live-line metal bar, disposed on the solder side, located between an orthogonal projection pattern of each of the sockets on the solder side and the neutral-line metal bar and having a plurality of first solder portions, wherein each of the first solder portions is electrically connected with the power-input pin of a corresponding switching module among the switching modules through the solder side,
wherein a gap is between each of the metal cross-lines and the component side, an orthogonal projection pattern of each of the metal cross-lines and an orthogonal projection pattern of the live-line metal bar intersect with each other on the component side.

2. The multiport power transmission apparatus according to claim 1, wherein each of the metal cross-lines is made of a metal material with zero temperature coefficient of resistance (TCR) or a low TCR (50-200 ppm/°C.).

3. The multiport power transmission apparatus according to claim 1, further comprising:
a detection module, disposed on the component side and electrically connected with the first terminals and the second terminals of the metal cross-lines through a plurality of traces on the PCB, detecting a voltage drop between the first terminal and the second terminal of each of the metal cross-lines or detecting a current flowing through each of the metal cross-lines, so as to measure a load power value of each of the sockets.

4. The multiport power transmission apparatus according to claim 1, wherein
the live-line metal bar, except the first solder portions, does not contact the PCB; and
the neutral-line metal bar, except the second solder portions, does not contact the PCB.

5. The multiport power transmission apparatus according to claim 1, wherein:
the first solder portions of the live-line metal bar are located on a long side of the live-line metal bar, a plurality of gaps is between the long side and the solder side, and another long side opposite to the long side has a bent portion.

6. The multiport power transmission apparatus according to claim 1, wherein:
the second solder portions of the neutral-line metal bar are located on a long side of the neutral-line metal bar, a plurality of gaps is between the long side and the solder side, and another long side opposite to the long side has a bent portion.

7. The multiport power transmission apparatus according to claim 1, wherein:
each of the first solder portions of the live-line metal bar is inserted into the component side through a corresponding conduction via on the solder side and is electrically connected with a first conduction plane of the solder side by means of molten-tin soldering;
the power-input pin of each of the switching modules is inserted into the solder side through a corresponding conduction via on the component side and is electrically connected with the first conduction plane of the solder side by means of molten-tin soldering;
the power-output pin of each of the switching modules is inserted into the solder side through a corresponding conduction via on the component side and is electrically connected with a second conduction plane of the solder side by means of molten-tin soldering;
the live-line pin of each of the sockets is inserted into the solder side through a corresponding conduction via on the component side and is electrically connected with the second conduction plane of the solder side by means of molten-tin soldering;
the neutral-line pin of each of the sockets is inserted into the solder side through a corresponding conduction via on the component side and is electrically connected with a third conduction plane of the solder side by means of molten-tin soldering;
the first terminal of each of the metal cross-lines is inserted into the solder side through a corresponding conduction via on the component side and is electrically connected with the third conduction plane of the solder side by means of molten-tin soldering;

the second terminal of each of the metal cross-lines is inserted into the solder side through a conduction via on the component side and is electrically connected with a fourth conduction plane of the solder side by means of molten-tin soldering; and each of the second solder portions of the neutral-line metal bar is inserted into the component side through a corresponding conduction via on the solder side and is electrically connected with the fourth conduction plane of the solder side by means of molten-tin soldering, wherein the second terminal of each of the metal cross-lines is directly soldered to a corresponding second solder portion among the second solder portions of the neutral-line metal bar.

8. The multiport power transmission apparatus according to claim 1, further comprising:

a ground-line metal bar, disposed on the solder side and having a plurality of third solder portions, each of the third solder portions being inserted into the component side through a corresponding conduction via on the solder side and is electrically connected with a ground plane of the solder side by means of molten-tin soldering, wherein each of the sockets further has a ground-line pin, the ground-line pin of each of the sockets is inserted into the solder side through a corresponding conduction via on the component side and is electrically connected the ground plane of the solder side by means of molten-tin soldering, wherein the ground-line pin of each of the sockets is directly soldered to a corresponding third solder portion among the third solder portions of the ground-line metal bar.

9. The multiport power transmission apparatus according to claim 8, wherein:

the third solder portions of the ground-line metal bar are located on a long side of the ground-line metal bar, a plurality of gaps is between the long side and the solder side, and another long side opposite to the long side has a bent portion.

\* \* \* \* \*